United States Patent
Nomura et al.

(10) Patent No.: US 6,882,761 B2
(45) Date of Patent: Apr. 19, 2005

(54) SILICON PLATFORM FOR OPTICAL MODULES

(75) Inventors: Takehiko Nomura, Tokyo (JP); Masayuki Iwase, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/767,231

(22) Filed: Jan. 22, 2001

(65) Prior Publication Data

US 2005/0058388 A1 Mar. 17, 2005

(51) Int. Cl.[7] ................................................. G02B 6/12
(52) U.S. Cl. ................................ 385/14; 385/2; 385/8; 385/13
(58) Field of Search ............................ 385/14, 2, 4, 6, 385/8, 10, 13, 77, 37; 257/81, 82

(56) References Cited

U.S. PATENT DOCUMENTS

| | | | |
|---|---|---|---|
| 5,024,966 A | | 6/1991 | Dietrich et al. ............... 437/60 |
| 5,150,280 A | * | 9/1992 | Arai et al. .................... 257/678 |
| 5,315,140 A | * | 5/1994 | Sugahara et al. ............ 257/306 |
| 5,555,115 A | * | 9/1996 | Mitsuoka et al. ........... 349/116 |
| 5,557,115 A | * | 9/1996 | Shakuda ...................... 257/680 |
| 5,714,773 A | * | 2/1998 | Burrows et al. ............. 257/432 |
| 6,164,836 A | * | 12/2000 | Yamada et al. .............. 385/132 |
| 6,333,598 B1 | * | 12/2001 | Hsu et al. ...................... 257/10 |
| 6,343,171 B1 | * | 1/2002 | Yoshimura et al. ........... 385/14 |
| 6,384,509 B1 | * | 5/2002 | Tomonari et al. ........... 310/307 |
| 6,459,154 B1 | * | 10/2002 | Kim ............................. 257/758 |

FOREIGN PATENT DOCUMENTS

| | | | | |
|---|---|---|---|---|
| DE | 197 19 853 A1 | | 5/1997 | ............. H01S/3/29 |
| JP | 59-29454 | | 2/1984 | ............ H01L/29/40 |
| JP | 64-61958 | | 3/1989 | ............ H01L/31/04 |
| JP | 5-37207 | | 2/1993 | ............. H01L/3/02 |
| WO | WO 8704565 | * | 7/1987 | ............ H01L/27/12 |

OTHER PUBLICATIONS

U.S. Appl. No. 09/478,518, filed Jan. 6, 2000, naming Masayuki Minamino and Masayuki Iwase as inventors, entitled "Light Receiving/Emitting Element Module and Manufacturing Method Thereof".

\* cited by examiner

*Primary Examiner*—K. Cyrus Kianni
(74) *Attorney, Agent, or Firm*—Oblon, Spivak, McClelland, Maier & Neustadt, P.C.

(57) ABSTRACT

A small-sized and low-cost silicon platform for optical modules which enables high-speed transmission. A conductor pattern is formed on an oxide layer formed on the surface of a silicon substrate through a dielectric film. A hole extending from the surface of the dielectric film to the oxide layer is formed in the dielectric film at a position for the formation of a bonding pad. A conductor material is directly formed on the oxide layer exposed to the bottom of this hole. This conductor material constitutes a bonding pad portion electrically connected to the conductor pattern.

14 Claims, 7 Drawing Sheets

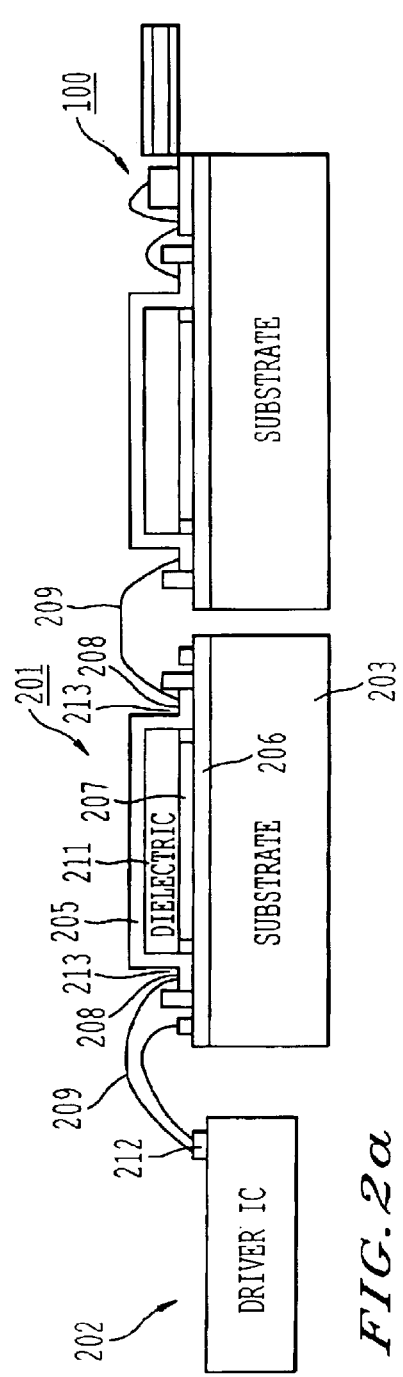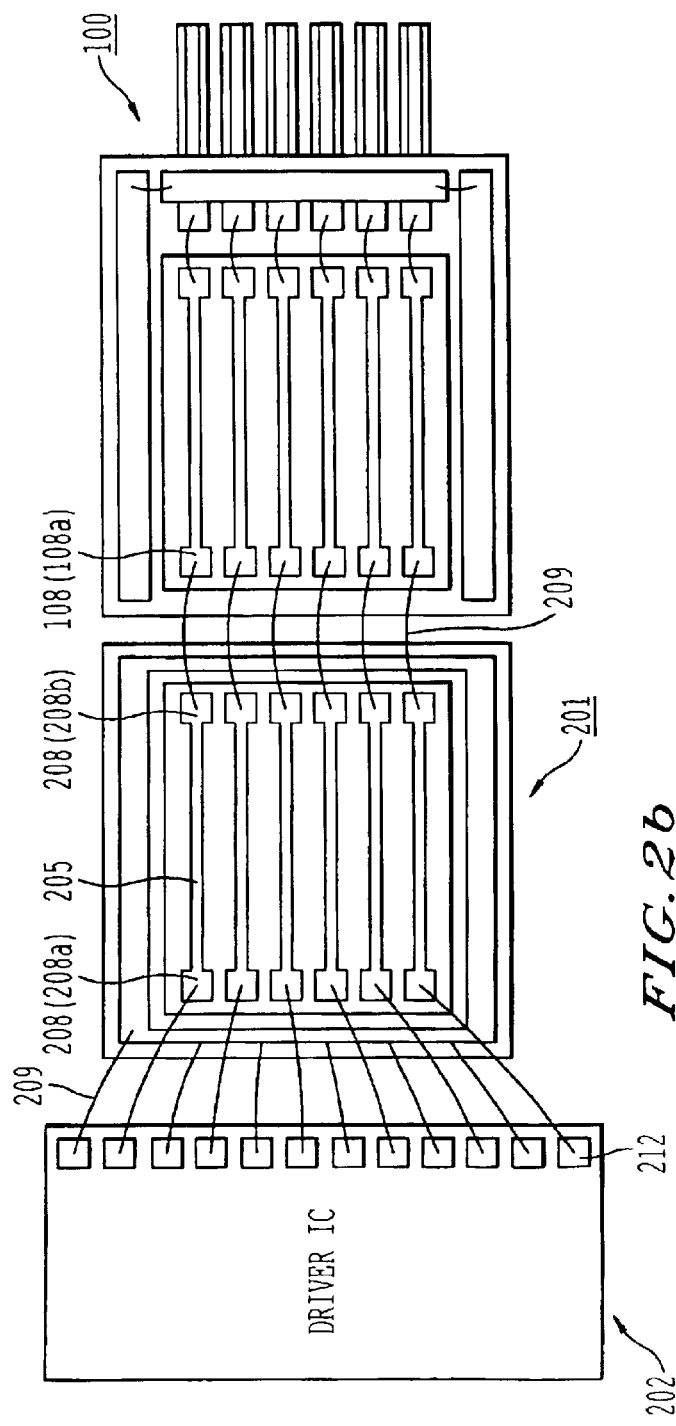

SILICON PLATFORM FOR OPTICAL MODULES

FIELD OF THE INVENTION

The present invention relates to a silicon platform for optical modules, which has a conductor pattern formed on a silicon substrate.

BACKGROUND OF THE INVENTION

In an optical communication system or optical data communication system, an optical module incorporating optical elements such as laser diodes is used. This optical module is now installed in homes along with recent progress made in computer hardware and communication networks. Thereby, demand for small-sized, highly integrated and low-cost optical modules arises.

To meet such demand, the development of the following optical module is under way. The optical module comprises a substrate on which optical elements such as light emitting elements and light-receiving elements and a conductor pattern are formed in a package and is connected to optical fibers or optical waveguide component for communication.

The substrate constituting the optical module is preferably a silicon substrate. The reason for this is that silicon (Si) has excellent workability. Therefore, for example, the silicon substrate has such an advantage that it is easy to put alignment marks for position determination on the silicon substrate when optical elements are to be mounted or to form V-shaped grooves for the position determination of optical fibers in the silicon substrate when the optical fibers are to be arranged.

Further, silicon has excellent heat radiation properties. Therefore, the silicon substrate has such an advantage that it can serve as a heat sink for radiating heat from optical elements. The silicon substrate has a further advantage that a raw material for the manufacture of the silicon substrate can be acquired at a low cost and has stable quality.

The silicon substrate having the advantages, on which optical elements, a conductor pattern and optionally the alignment marks and V-shaped grooves are formed is called "silicon platform for optical modules."

FIG. 5 shows a typical example of the silicon platform for optical modules. The silicon platform for optical modules shown in FIG. 5 has a silicon substrate 505 and an $SiO_2$ insulating layer 507 which is an oxide layer formed on the silicon substrate 505. A light-receiving element 501 and a light emitting element 504 all of which are optical elements are mounted on the $SiO_2$ insulating layer 507 through a conductor pattern 506. A microstrip line structure is formed on the $SiO_2$ insulating layer 507 at a position other than the area for mounting the optical elements 501 and 504. This microstrip line structure is a laminate consisting of a ground film 510, a dielectric film 509 and signal lines (conductor pattern) 508, all formed in the order named.

The conductor pattern 506 formed in the area for mounting the optical elements 501 and 504 and the signal lines 508 of the microstrip line structure are electrically connected to each other by lead wires 502. Thereby, the optical elements 501 and 504 are electrically connected to the signal lines 508 by the conductor pattern 506 and the lead wires 502.

The silicon substrate 505 has a thickness of about 1 mm, for example. The dielectric film 509 is made from polyimide, for example. This dielectric film 509 has the function of insulating the ground film 510 from the conductor pattern 508.

The silicon platform for optical modules shown in FIG. 5 is constituted as described above. A typical example of optical module comprising this silicon platform for optical modules is shown in FIG. 6. In FIG. 6, the silicon platform for optical modules is mounted on a substrate 601. A wiring pattern 602 and lead frames 611 are formed and a part 603 such as a preamplifier IC are mounted on the substrate 601. External connection terminals are further provided on the substrate 601 as required.

The substrate 601 having the silicon platform for optical modules and the part 603 mounted thereon, for example, is incorporated in a package (not shown) together with an optical ferrule 613 shown in FIG. 6 to constitute an optical module. The optical ferrule 613 is connected to one ends of optical fibers 612. The other ends of the optical fibers 612 are drawn out to the outside of the package. To store the optical ferrule 613 in the package of the optical module, the optical ferrule 613 is arranged such that the optical fibers 612 can be optically connected to the optical elements 501 and 504.

Since the silicon platform for optical modules shown in FIG. 5 has both the light-receiving element 501 and the light emitting element 504 as described above, the optical module shown in FIG. 6 comprising the silicon platform for optical modules can be an optical module for two-way communication.

Both the light-receiving element 501 and the light emitting element 504 are mounted on the silicon platform for optical modules shown in FIG. 5 and FIG. 6 as described above. As a matter of course, there are the following silicon platforms for optical modules besides the silicon platform. For example, there is a silicon platform for optical modules, which comprises only one of the light-receiving element 501 and the light emitting element 504. As shown in FIG. 7, there is also a silicon platform for optical modules which comprises an optical array element 701, on which a plurality of light-receiving elements 501 or light emitting elements 504 are disposed in an array.

OBJECTS AND SUMMARY OF THE INVENTION

The silicon platform for optical modules has such a problem as the deterioration of transmission signals through the lead wires 502 or signal lines 508 along with an increase in the transmission speed of signals.

To prevent the deterioration of the transmission signals, it is necessary to carry out the matching of impedance between the optical elements 501 and 504 and the signal lines 508. Therefore, a silicon platform for optical modules is constructed to realize the matching of impedance between the optical elements 501 and 504 and the signal lines 508 in consideration of the downsizing of the optical module and crosstalk between adjacent signal lines 508. However, to this end, the thickness of the dielectric film 509 of the microstrip line structure must be made very small.

An example will be shown. For example, a case where the matching of impedance between the light emitting element 501 and the leader line 508 to be electrically connected to the light emitting element 501 is carried out will be described hereinafter. When the serial resistance value of a laser diode which is the light emitting element 501 is 5 to 10 Ω, the characteristic impedance Zo of the leader line 508 must be set to 5 to 10 Ω which is the same as the serial resistance value of the light emitting element 501.

To this end, the ratio (H/W) of the thickness H of the dielectric film 509 underlying the leader line 508 with respect to the line width W of the leader line 508 must be about 0.06.

When a plurality of optical elements are arranged, in consideration of the downsizing of the silicon platform for optical modules (that is, the downsizing of the optical module), these optical elements are preferably arranged at the same pitch as the pitch of the optical fibers of the optical fiber tape to be optically connected to the optical elements. According to the current standards for the optical fiber tapes, the pitch of the optical fibers is 250 μm.

When the signal lines 508 are arranged according to the lay-out of the optical elements as shown in FIG. 5, the pitch of the signal lines 508 is the same as the pitch of the optical elements. When the pitch of the signal lines 508 and crosstalk between the adjacent signal lines 508 are taken into consideration, the line width W of the signal lines 508 is desirably smaller than 100 μm.

To realize the matching of impedance between the optical elements and the signal lines 508 while the line width W of the signal lines 508 is fixed, the thickness H of the dielectric film 509 must be made smaller than about 6 μm based on the requirement for the ratio, that is (H/W)=0.06, of the thickness H of the dielectric film 509 with respect to the line width W of the signal lines 508.

However, if the dielectric film 509 is made thin to such an extent, when the wire 502 is to be bonded to the leader line 508 on the dielectric film 509, the dielectric film 509 may be peeled off by bonding impact and the leader line 508 may be damaged. To eliminate this problem, the thickness H of the dielectric film 509 must be made 20 to 30 μm or more.

However, to realize the matching of impedance between the optical elements and the signal lines 508 while the dielectric film 509 is made thick, the line width W of the signal lines 508 must be made large. In addition to this, in consideration of the above-described crosstalk problem, the pitch of the signal lines 508 must be expanded. Thereby, the silicon substrate must be made large in size.

That is, the dielectric film 509 is made thick to prevent the damage of the signal lines 508 caused by the bonding of the wires 502, and the silicon platform for optical modules becomes large in size to realize the matching of impedance between the optical elements and the signal lines 508.

It is an object of the present invention which has been made to solve the problems to provide a silicon platform for optical modules which can increase the speed of a transmission signal and can be reduced in size with ease and further can prevent such a problem as the exfoliation of a conductor pattern (bonding pad portion) caused by the bonding of wires.

To attain this object and solve the problem, the present invention is constituted as described below. That is, according to a first aspect of the present invention, there is provided a silicon platform for optical modules which comprises a silicon substrate, a first insulating layer formed on this silicon substrate, a first conductor layer formed on the first insulating layer, a second insulating layer formed on the first conductor layer and a second conductor layer formed on the second insulating layer, an end portion of the second conductor layer overlying the first insulating layer to constitute bonding portions to be connected to lead wires.

According to a second aspect of the present invention, in the first aspect of the invention, the silicon platform is characterized in that a hole is formed in the second insulating layer and a bonding portion is formed in this hole.

According to a third aspect of the present invention, in the first aspect of the invention, the silicon platform is characterized in that a removed portion is formed in the second insulating layer and a bonding portion is formed in this removed portion.

According to a fourth aspect of the present invention, in the first, the second or the third aspect of the invention, the silicon platform is characterized in that the thickness of the second insulating layer is 6 μm or less.

According to a fifth aspect of the present invention, in the first or the fourth aspect of the invention, the silicon platform is characterized in that optical elements are mounted and an end portion of the second conductor layer lies right below the optical elements.

According to a sixth aspect of the present invention, in any one of the first to the fifth aspects of the invention, the silicon platform is characterized in that a bulky portion is formed on part of the first insulating layer.

According to a seventh aspect of the present invention, in any one of the first to the sixth aspects of the invention, the silicon platform is characterized in that the first conductor layer, the second insulating layer and the second conductor layer constitute a microstrip line structure.

According to an eighth aspects of the present invention, in any one of the first to the seventh aspects of the invention, the silicon platform is characterized in that the second conductor layer constitutes a coplanar distribution constant circuit structure.

According to a ninth aspect of the present invention, in any one of the first to the eighth aspects of the invention, the silicon platform is characterized in that a silicon platform for optical modules is electrically connected to a driver IC by lead wires.

According to a tenth aspect of the present invention, in any one of the first to the ninth aspects of the invention, the silicon platform is characterized in that at least one of a light emitting element and a light-receiving element are mounted on the silicon platform.

According to an eleventh aspect of the present invention, in any one of the first to the tenth aspects of the invention, the silicon platform is characterized in that the first insulating layer is an oxide layer.

According to a twelfth aspect of the present invention, in any one of the first to the eleventh aspects of the invention, the silicon platform is characterized in that the first insulating layer is an $SiO_2$ insulating layer.

According to a thirteenth aspect of the present invention, in any one of the first to the twelfth aspects of the invention, the silicon platform is characterized in that the second insulating layer is a resin film.

According to a fourteenth aspect of the present invention, in any one of the first to the thirteenth aspects of the invention, the silicon platform is characterized in that the second insulating layer is a polyimide film.

According to the present invention, an end portion of the second conductor layer overlies the first insulating layer to constitute bonding portions. Bonding strength between the conductor layer and the insulating layer is higher than bonding strength between the dielectric film and the oxide layer. Therefore, such a problem that the bonding pads peel off from the oxide layer (insulating layer) when the lead wires are bonded to the respective bonding pads is almost eliminated.

Since the problem that the bonding pads peel off from the oxide layer rarely arises, the dielectric film can be made thin without worrying about the problem. Thereby, the size of the silicon platform for optical modules can be reduced and it is easy to realize the matching of impedance between the conductor pattern which is the second conductor layer and the optical elements electrically connected to the conductor pattern, thereby preventing the deterioration of transmission signals, and making it easy to increase the speed of transmission signals.

Use of this silicon platform for optical modules makes it possible to provide a small-sized and highly integrated optical module and which is moreover capable of high-speed transmission of signals at a low cost.

Since the exfoliation of bonding pads occurs in the prior art, it is necessary to bond wires carefully. In contrast to this, thanks to the special structure of the present invention, a silicon platform for optical modules can be manufactured without worrying about the problem of exfoliation of the bonding pads.

In the structure that the end portion of the second conductor layer lies right below the optical elements, the optical elements can be electrically connected to the conductor pattern, which is the second conductor layer without using lead wires. Thereby, the problem of the prior art, that is, the exfoliation of the bonding pads caused by the bonding of the wires does not occur. Therefore, the dielectric film of the microstrip line structure can be made thin without worrying about the exfoliation of the bonding pads.

This makes it easy to realize the matching of impedance between the conductor pattern (second conductor layer) and the optical elements electrically connected to the conductor pattern. Therefore, a small-sized silicon platform for optical modules, which prevents the deterioration of transmission signals and is capable of transmitting signals at high speed, can be provided.

Further, the optical elements and the conductor pattern (second conductor layer) of the microstrip line structure are electrically connected to each other without using lead wires. Therefore, the step of bonding the lead wires for electrically connecting the conductor patterns can be omitted. Thereby, the production process can be simplified.

BRIEF DESCRIPTION OF THE DRAWINGS

These and other objects and advantages of the present invention will become more apparent and more readily appreciated from the following detailed description of the exemplary embodiments of the invention taken in conjunction with the accompanying drawings, in which:

FIG. 2a is a sectional view for explaining a silicon platform for optical modules according to a second embodiment of the present invention and FIG. 2b is a plan view for explaining the silicon platform for optical modules according to the second embodiment of the present invention;

DETAILED DESCRIPTION OF THE PREFERRED EMBODIMENTS

The present invention will be described in detail hereinafter with reference to the accompanying drawings of preferred embodiments.

Figure 1A:
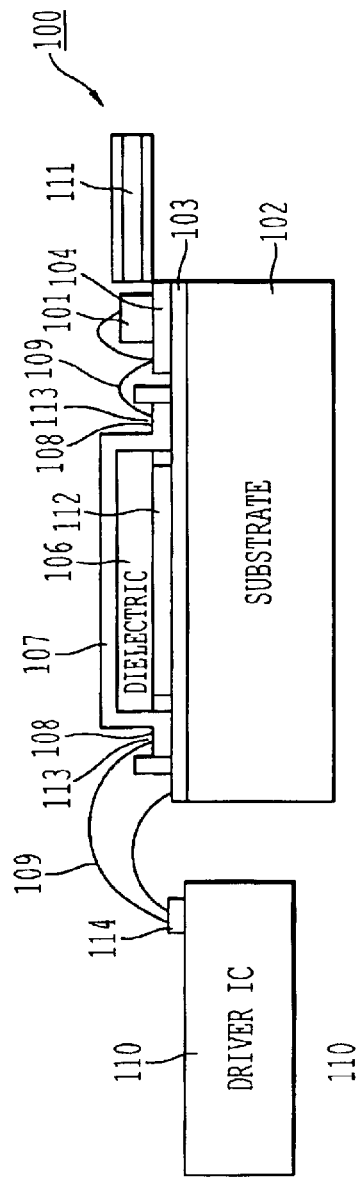
FIG. 1a is a sectional view for explaining a silicon platform for optical modules according to a first embodiment of the present invention and FIG. 1b is a plan view for explaining the silicon platform for optical modules according to the first embodiment of the present invention.
Figure 1B:
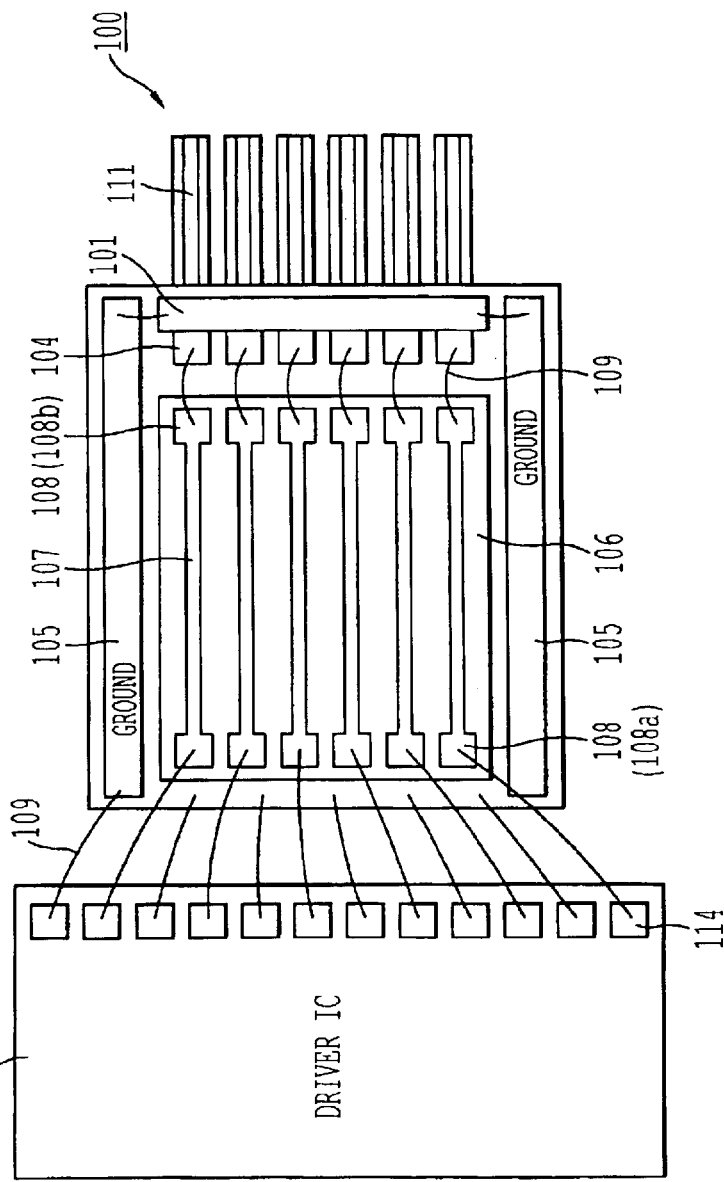

FIG. 1a is a sectional view of a platform for optical modules according to a first embodiment of the present invention, which is, connected to a driver IC 110 and optical fibers 111. FIG. 1b is a plan view of the platform for optical modules of the first embodiment, which is, connected to the driver IC 110 and the optical fibers 111 as in FIG. 1a.

The platform 100 for optical modules of the first embodiment shown in FIG. 1a and FIG. 1b has a laser diode array 101 which is an optical element mounted thereon and signal lines 107 which are a conductor pattern formed thereon.

That is, the platform 100 for optical modules of the first embodiment has a silicon substrate 102. This silicon substrate 102 has a thickness of about 1 mm, a width of about 6 mm, a length of about 3 mm and a resistivity of about 2,000 $\Omega$cm. An $SiO_2$ insulating layer (first insulating layer) 103 which is an oxide layer is formed on the surface of the silicon substrate 102 by a thermal oxidation method.

A wiring pattern 104 is formed in an area for mounting the laser diode array 101 (optical element mounting area) on the $SiO_2$ insulating layer 103. This wiring pattern 104 is a conductor pattern made from copper or gold and the laser diode array 101 is mounted on this wiring pattern 104.

In this first embodiment, as shown in FIG. 1a and FIG. 1b, the optical fibers 111 are connected to an end portion of the silicon platform 100 for optical modules. The laser diode array 101 emits light toward the optical fibers 111 and is optically coupled with the optical fibers 111. For example, the laser diode array 101 consists of 6 end emission type laser diodes disposed in an array and comprising a resonator made of a double-hetero structure InGaAsP active layer formed on an InP substrate. Each of the light emitting diodes has an oscillation wavelength of 1.31 $\mu$m and a threshold current of 5 mA. The wiring pattern 104 is formed in accordance with the lay-out of the light emitting elements.

The laser diode array 101 is mounted in an area on the end side of the silicon substrate 102 on which the optical fibers 111 are provided to carry out optical coupling between the laser diode array 101 and the optical fibers 111. V-shaped grooves for the position determination of the optical fibers 111 are formed in the silicon substrate 102 and an optical ferrule is provided at the end portions of the optical fibers 111. The V-shaped grooves and the ferrule are not shown in FIG. 1a and FIG. 1b.

As shown in FIG. 1a and FIG. 1b, a ground film 105 which is a first conductor layer and a microstrip line structure are formed on the $SiO_2$ insulating layer 103 at a position other than the optical element mounting area. As shown in FIG. 1a, this microstrip line structure is a laminate consisting of the ground film (first conductor layer) 112, a dielectric film (second insulating layer) 106 and the signal lines (second conductor layer) 107 which is a conductor pattern, all formed in the order named. In this first embodiment, the signal lines 107 of the microstrip line structure are arranged in accordance with the lay-out of the optical elements of the laser diode array 101.

Bonding pads 108 (108a, 108b) for connecting the lead wires 109 are formed on both end portions of the signal lines

107. The bonding pad 108a on one end side of the signal lines 107 is connected to respective bonding pads 114 formed on the driver IC 110 shown in FIG. 1a and FIG. 1b by lead wires 109. The bonding pads 108b on the other end side of the signal lines 107 are electrically connected to the wiring pattern 104 by lead wires 109 as shown in FIG. 1b.

The wiring pattern 104, ground films 105 and 112, dielectric film 106 and signal lines 107 are formed to predetermined patterns by deposition and a lift-off method using photolithography.

In this first embodiment, the dielectric film 106 is a resin film (for example, a polyimide film) and has a thickness of about 2 $\mu$m, for example.

This first embodiment is characterized in that it has a structure capable of preventing the occurrence of such a problem that the bonding pads 108 peel off when the lead wires 109 are to be bonded to the bonding pads 108.

That is, as shown in FIG. 1a, a hole (removed portion) 113 is formed in the dielectric film 106 of the microstrip line structure at a position for the formation of the bonding pad 108. This hole 113 is a hole extending from the surface of the dielectric film 106 to the SiO$_2$ insulating layer 103. This hole 113 is formed by removing part of the dielectric film 106 by the patterning of the dielectric film 106. A conductor material is directly formed on the SiO$_2$ insulating layer 103 exposed to the bottom of this hole 113. This conductor material is connected to the leader line 107 and constitutes the bonding pad 108.

According to this first embodiment, the bonding pads 108 are directly formed on the SiO$_2$ insulating layer 103. Bonding strength between the conductor material and the SiO$_2$ insulating layer is higher than bonding strength between the dielectric film and the SiO$_2$ insulating layer. Therefore, such a problem that the bonding pads 108 made from a conductor material peel off from the SiO$_2$ insulating layer 103 when the lead wires 109 are bonded can be almost suppressed. Thereby, the dielectric film 106 can be made thin without worrying about the exfoliation of the bonding pad 108.

In this first embodiment, the line width of the signal lines 107 is made small (for example, about 70 $\mu$m) and the interval between the adjacent signal lines 107 is made narrow in consideration of a reduction in the size of the silicon platform 100 for optical modules and crosstalk. In addition, the dielectric film 106 can be made thin without worrying about the exfoliation of the bonding pads 108. Therefore, it is easy to realize the matching of impedance between the signal lines 107 and the optical elements 101 by reducing the thickness of the dielectric film 106. Thereby, high-speed transmission of signals can be realized while the deterioration of the transmission signals is prevented.

Therefore, this first embodiment can provide such an excellent effect that a small-sized silicon platform for optical modules which enables high-speed transmission of signals can be provided by the special constitution.

A second embodiment of the present invention will be described hereinafter. In this second embodiment, the present invention is applied to a silicon platform 201 for optical modules which does not have any optical elements mounted thereon, as shown in the sectional view of FIG. 2a and the plan view of FIG. 2b. That is, the silicon platform 201 for optical modules of this second embodiment is such as shown in FIG. 2a and FIG. 2b that it is provided between the silicon platform 100 for optical modules of the first embodiment and the driver IC 202 and electrically connects the optical elements of the silicon platform 100 for optical modules to the driver IC 202. As the silicon platform 100 for optical modules has already been described in the section of the first embodiment, its description is omitted in this second embodiment.

In the silicon platform 201 for optical modules of this second embodiment, an SiO$_2$ insulating layer (first insulating layer) 206 which is an oxide layer is formed on the surface of a silicon substrate 203. A microstrip line structure is constructed on this SiO$_2$ insulating layer 206. This microstrip line structure is a laminate consisting of a ground film 207 which is a first conductor layer, a dielectric film (for example, a polyimide film) 211 which is a second insulating layer, and signal lines (second conductor layer) 205 which are a conductor pattern, all formed in the order named. On both end sides of the signal lines 205 of this microstrip line structure, bonding pads 208 (208a, 208b) are provided.

In the example shown in FIG. 2a and FIG. 2b, the bonding pads 208a on one end side of the signal lines 205 are electrically connected to the respective bonding pads 212 of the driver IC 202 by lead wires 209. The bonding pads 208b on the other end side of the signal lines 205 are connected to the respective bonding pads 108a of the silicon platform 100 for optical module of the first embodiment by lead wires 209.

This second embodiment is characterized in that it has a special structure for preventing such a problem as the exfoliation of the bonding pads 208 caused by the bonding of the lead wires 209 like the first embodiment.

That is, as shown in FIG. 2a, a hole 213 extending from the surface of the dielectric film 211 to the SiO$_2$ insulating layer 206 is formed in the dielectric film 211 of the microstrip line structure at a position for the formation of the bonding pad 208. A conductor material is directly formed on the SiO$_2$ insulating layer 206 exposed to the bottom of the hole 213. This conductor material constitutes the bonding pad 208 electrically connected to the leader line 205.

According to this second embodiment, like the first embodiment, the bonding pad 208 is directly formed on the SiO$_2$ insulating layer 206 by forming the hole 213 in the dielectric film 211 of the microstrip line structure at the position for the formation of the bonding pad 208. Bonding strength between the conductor material constituting the bonding pad 208 and the SiO$_2$ insulating layer is higher than bonding strength between the dielectric film 211 and the SiO$_2$ insulating layer 206. Therefore, such a problem that the bonding pads 208 peel off from the SiO$_2$ insulating layer when the lead wires 209 are bonded to the respective bonding pads 208 is almost prevented.

As described in the section of the first embodiment, the dielectric film 211 can be made thin without worrying about the exfoliation of the bonding pads 208. As a result, the second embodiment can provide such an effect that a small-sized silicon platform for optical modules which enables the high-speed transmission of signals can be provided at a low cost.

A third embodiment of the present invention will be described hereinafter. In the embodiments, the optical elements (laser diode array) 101 are mounted on the silicon platform 100 for optical modules. In contrast to this, in this third embodiment, the present invention is applied to a silicon platform for optical modules on which a light emitting element and a light-receiving element are both mounted.

Figure 3A:
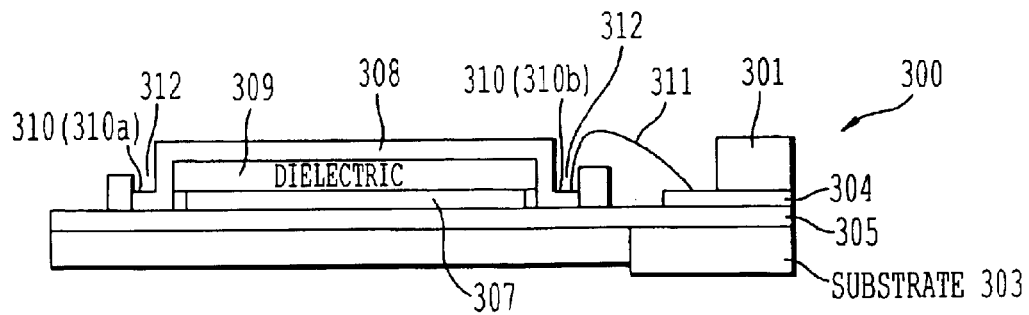
FIG. 3a is a sectional view for explaining a silicon platform for optical modules according to a third embodiment of the present invention and FIG. 3b is a plan view for explaining the silicon platform for optical modules according to the third embodiment of the present invention.
Figure 3B:
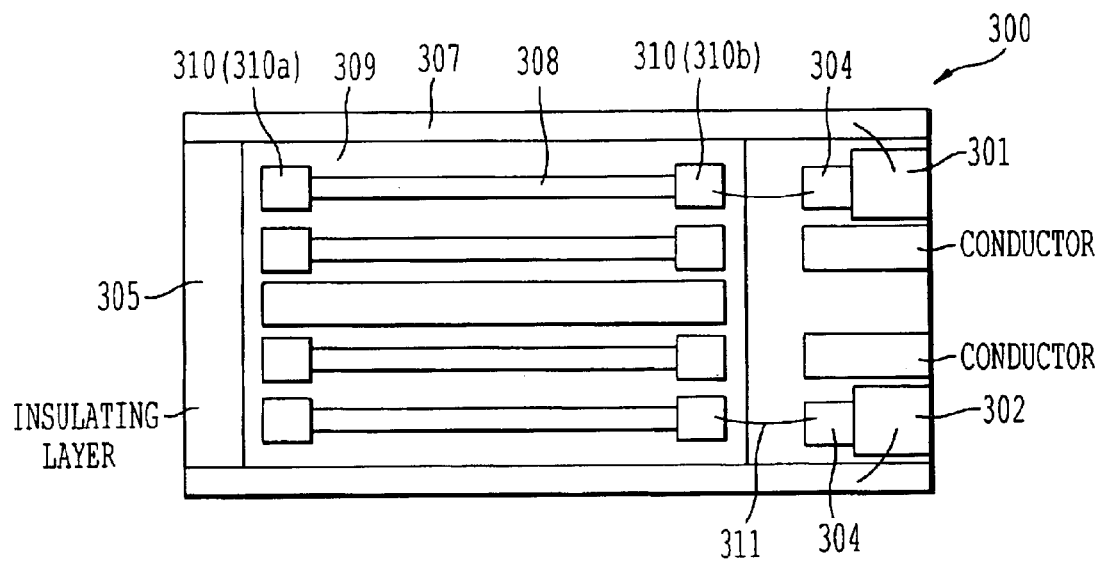

FIG. 3a is a sectional view of the silicon platform for optical modules according to this third embodiment. FIG. 3b is a plan view of the silicon platform for optical modules according to the third embodiment.

In this silicon platform 300 for optical modules of the third embodiment, an SiO$_2$ insulating layer (first insulating layer) 305 which is an oxide layer is formed on the surface of a silicon substrate 303. A light emitting element 301 and a light-receiving element 302, both of which are optical, elements are mounted on the SiO$_2$ insulating layer 305 through wires 304, which are a conductor pattern. A microstrip line structure is formed on the SiO$_2$ insulating layer 305 at a position other than the area for the formation of the optical elements 301 and 302. This microstrip line structure is a laminate consisting of a ground film (first conductor layer) 307, a dielectric film (second insulating layer) 309, and signal lines (second conductor layer) 308 which is a conductor pattern, all formed in the order named as shown in FIG. 3a.

On both end sides of the signal lines 308 of the microstrip line structure, bonding pads 310 (310a and 310b) are provided. The bonding pads 310a on one end side of the signal lines 308 are electrically connected to the driver IC shown in the embodiments by lead wires. The bonding pads 310b on the other end side of the signal lines 308 are electrically connected to the wires 304 by lead wires 311 as shown in FIG. 3b. Thereby, the optical elements 301 and 302 are electrically connected to be above signal lines 308 through the wires 304, the lead wires 311 and the bonding pads 310b.

This third embodiment is characterized by the special structure of the bonding pads 310 like the embodiments. That is, as shown in FIG. 3a, a hole 312 extending from the surface of the dielectric film 309 to the SiO$_2$ insulating layer 305 is formed in the dielectric film 309 of the microstrip line structure at a position for the formation of the bonding pad 310. A conductor material is directly formed on the SiO$_2$ insulating layer 305 exposed to the bottom of the hole 312. This conductor material constitutes the bonding pad 310 electrically connected to the leader line 308.

Since the bonding pads 310 are formed in this third embodiment like the embodiments, the same effect as in the embodiments can be provided.

Figure 4A:
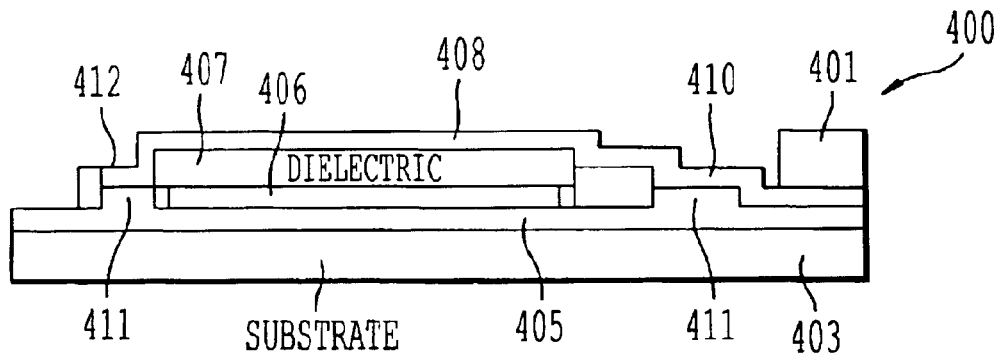
FIG. 4a is a sectional view for explaining a silicon platform for optical modules according to a fourth embodiment of the present invention and FIG. 4b is a plan view for explaining the silicon platform for optical modules according to the fourth embodiment of the present invention.
Figure 4B:
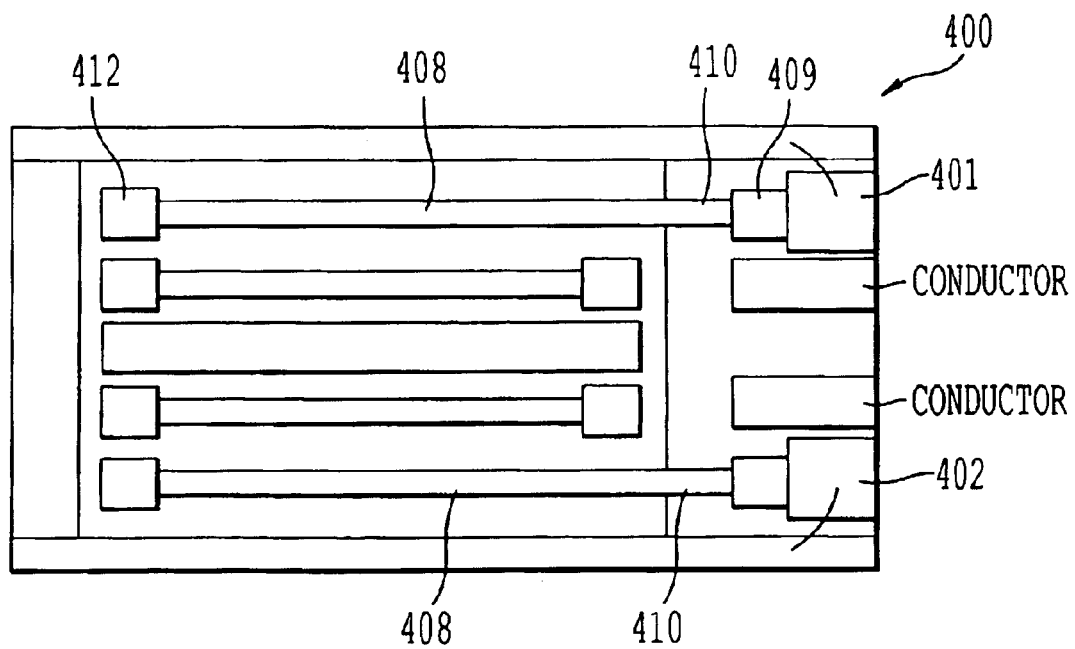
Figure 5:
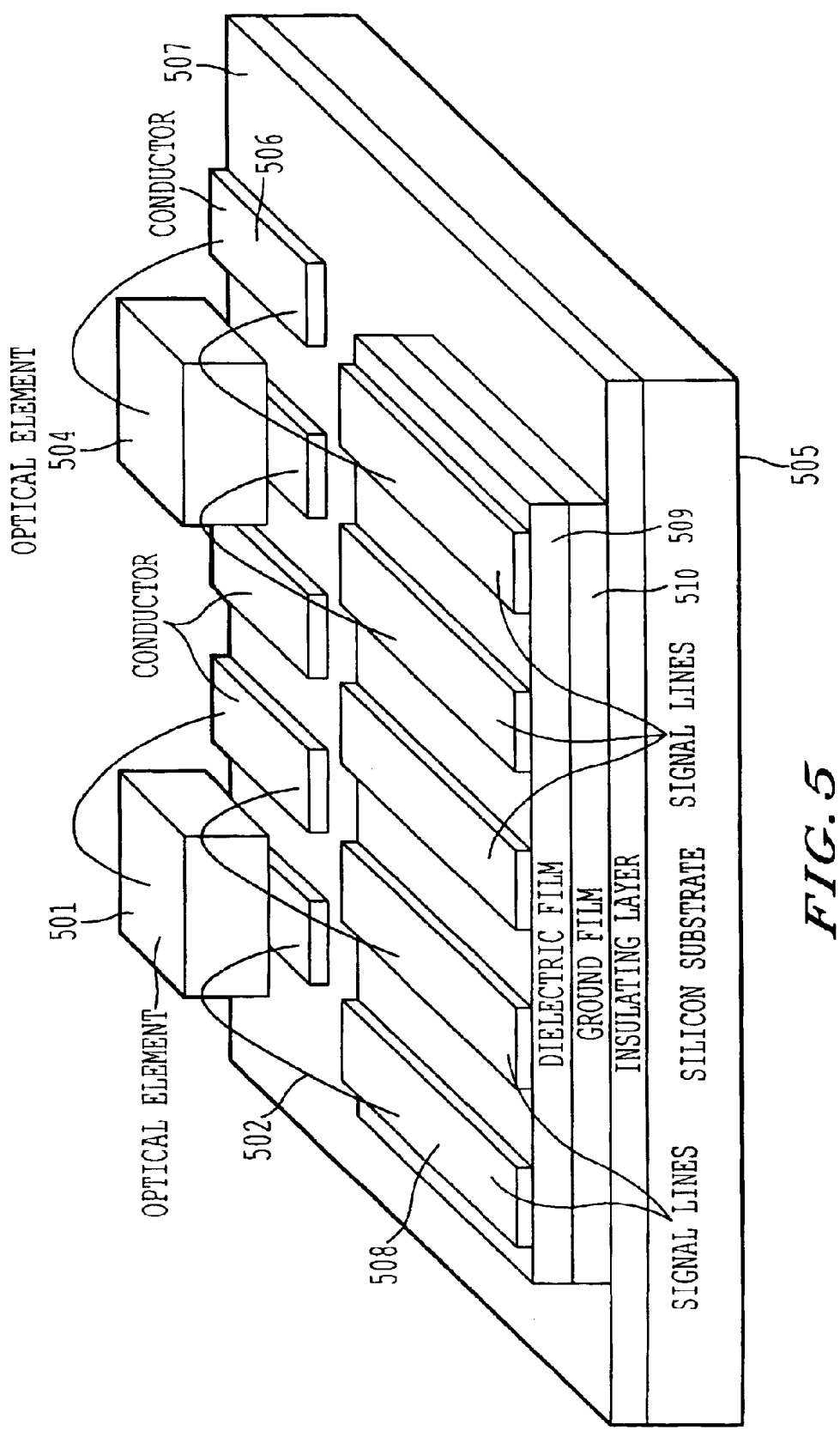
FIG. 5 is a perspective view showing a typical example of silicon platform for optical modules.

A fourth embodiment of the present invention will be described hereinafter. In this fourth embodiment, such a problem as the exfoliation of the bonding pads is eliminated by a special structure different from that of the embodiments. FIG. 4a is a sectional view of a silicon platform for optical modules according to the fourth embodiment. FIG. 4b is a plan view of the silicon platform for optical modules according to the fourth embodiment.

In this fourth embodiment, like the third embodiment, an SiO$_2$ insulating layer 405 which is a first insulating layer is formed on the surface of a silicon substrate 403. A light emitting element 401 and a light-receiving element 402 which are optical elements are mounted on the SiO$_2$ insulating layer 405 through a conductor pattern 409 which is a first conductor layer. A microstrip line structure is formed on the SiO$_2$ insulating layer 405 at a position other than the area for mounting the optical elements 401 and 402. This microstrip line structure is a laminate consisting of a ground film 406 which is a first conductor layer, a dielectric film 407 which is a second insulating layer and signal lines (second conductor layer) 408 which is a conductor pattern, all formed in the order named as shown in FIG. 4a.

This fourth embodiment is characterized in that the signal lines 408 of the microstrip line structure and the conductor pattern 409 in the area for mounting the optical elements to be connected to the signal lines 408 are electrically connected by a connection conductor pattern 410 as shown in FIG. 4a and FIG. 4b.

According to this fourth embodiment, the optical elements 401 and 402 can be electrically connected to the signal lines 408 without using lead wires. Therefore, bonding pads for connecting the optical elements 401 and 402 to the signal lines 408 can be eliminated. As a result, such a problem as the exfoliation of the bonding pads for electrical connection between the optical elements 401 and 402 and the signal lines 408 does not arise.

Also in this fourth embodiment, the bonding pads 412 in the signal lines 408 of the microstrip line structure have the same structure as in the embodiments. That is, a hole is formed in the dielectric film 407 and the bonding pad 412 is directly formed on the SiO$_2$ insulating layer 405.

Since the silicon substrate 403 has excellent heat radiation properties, it can serve as a heat sink for radiating heat from the optical elements 401 and 402. However, when the SiO$_2$ insulating layer 405 on the surface of the silicon substrate 403 is made thick, the efficiency of head transfer from the optical elements 401 and 402 to the silicon substrate 403 worsens. Therefore, the SiO$_2$ insulating layer 405 is desirably made as thick as about 500 nm.

However, when the conductor portion is directly formed on the SiO$_2$ insulating layer 405 like the connection wiring pattern 410 and the bonding pads 412, parasitic capacitance is produced between the conductor portion and the silicon substrate 403. Therefore, when the SiO$_2$ insulating layer 411 is made thin in consideration of the heat radiation properties of the optical elements 401 and 402, parasitic capacitance between the conductor portion and the silicon substrate 403 becomes very large. Such large parasitic capacitance affects high-frequency transmission signals, thereby deteriorating high-frequency characteristics.

To solve this problem, in this fourth embodiment, a bulky portion 411 is formed on the SiO$_2$ insulating layer 405 at a position for the formation of the connection conductor pattern 410 and a position for the formation of the bonding pad 412. This bulky portion 411 expands the interval between the conductor portion and the silicon substrate 403, thereby reducing parasitic capacitance between the conductor portion and the silicon substrate 403. Thereby, the deterioration of the high-frequency characteristics can be prevented.

The bulky portion 411 can be formed as follows. For example, the SiO$_2$ insulating layer 405 is formed on the surface of the silicon substrate 403 to a thickness of 2 $\mu$m, for example, by thermal CVD. Thereafter, the thickness of the SiO$_2$ insulating layer 405 except the area for the formation of the bulky portion 411 is reduced to 500 nm, for example, by photolithography and etching. Thus, a thin film portion and the bulky portion 411 can be formed on the SiO$_2$ insulating layer 405.

In the fourth embodiment, heat radiation from the optical elements 401 and 402 can be improved by reducing the thickness of the SiO$_2$ insulating layer 405 in the area for mounting the optical elements 401 and 402. In addition, the bulky portion 411 is formed on a portion for the formation of the conductor portion of the SiO$_2$ insulating layer 405 except the area for mounting the optical elements 401 and 402. Therefore, the deterioration of high-frequency characteristics can be prevented as described above.

The present invention is not limited by the embodiments and can be embodied in various ways. For example, in the embodiments, the optical elements mounted on the silicon platform for optical modules are directly connected to optical fibers. For example, planar waveguides (PLC) may be mounted on a silicon platform for optical modules and the optical elements may be indirectly bonded to the optical fibers through the PLC.

In the embodiments, the conductor pattern formed on the silicon platform for optical modules constitutes the microstrip line structure. For example, a conductor pattern constituting a coplanar distribution constant circuit may be mounted on a silicon platform for optical modules.

Further, in the embodiments, the present invention is applied to a silicon platform for optical modules on which a light emitting element, or both of a light emitting element and a light-receiving element are mounted. As a matter of course, the present invention can be applied to a silicon platform for optical modules on which only a light-receiving element out of the light emitting element and light-receiving element is mounted.

Figure 6:
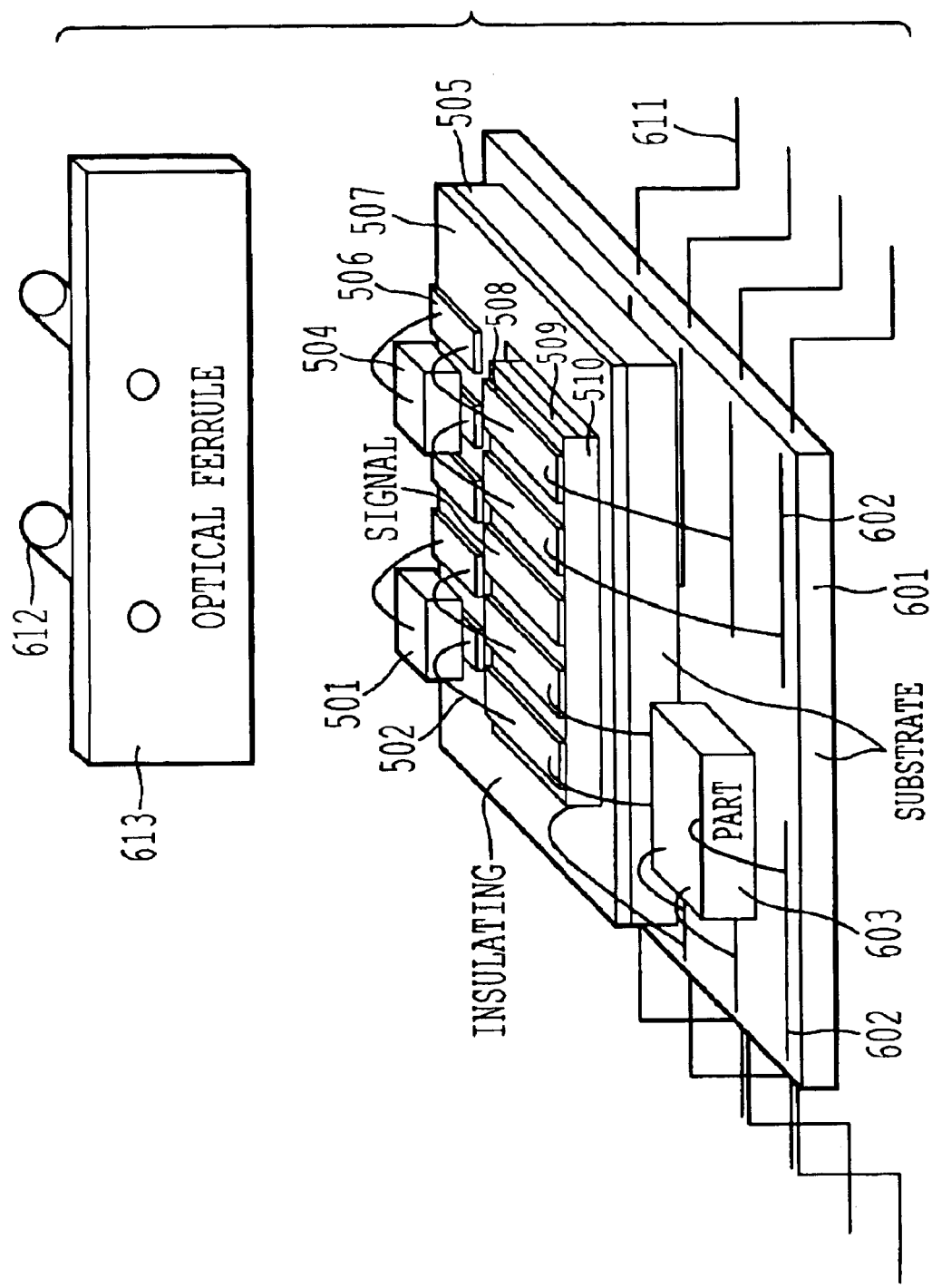
FIG. 6 is a diagram for explaining an example of optical module comprising the silicon platform for optical modules shown in FIG. 5.
Figure 7:
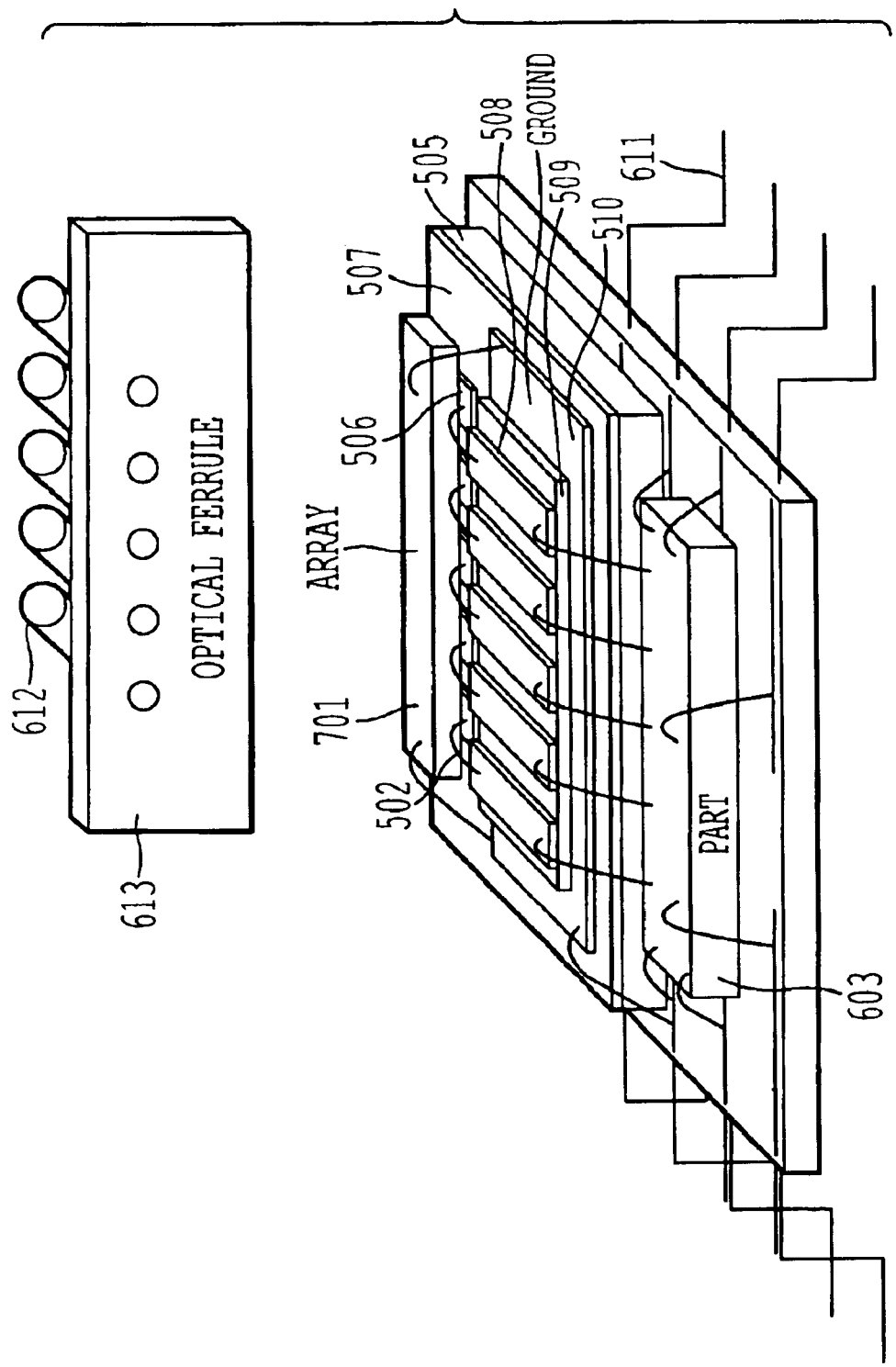
FIG. 7 is a model diagram showing an example of silicon platform for optical modules on which a plurality of optical elements disposed in an array are mounted and an example of optical module comprising the silicon platform.

Further, the constitution of an optical module comprising the platform for optical modules is not limited to those shown in FIG. 6 and FIG. 7. The optical module comprising the platform for optical modules is various in constitution. The silicon platform for optical modules to which the present invention is applied may be incorporated in any one of the optical modules.

What is claimed is:

1. A silicon platform for optical modules comprising:
   a silicon substrate;
   a first insulating layer formed on the silicon substrate;
   a first conductor layer formed on the first insulating layer;
   a second insulating layer formed on the first conductor layer; and
   a second conductor layer formed on the second insulating layer, wherein
   an end portion of the second conductor layer is in direct contact with the first insulating layer to constitute a bonding portion to be connected to a lead wire.

2. A silicon platform for optical modules according to claim 1, wherein a hole is formed in the second insulating layer and the bonding portion is formed in the hole.

3. A silicon platform for optical modules according to claim 1, wherein a portion in the second insulating layer is removed and the bonding portion is formed in the portion.

4. A silicon platform for optical modules according to claim 1, wherein the second insulating layer has a thickness of 6 $\mu$m or less.

5. A silicon platform for optical modules according to claim 1, wherein an optical element is mounted on a conductor pattern formed thereon and the second conductor layer is connected to the conductor pattern through a connection conductor pattern.

6. A silicon platform for optical modules according to claim 5, wherein a portion of the first insulating layer below the connection conductor pattern and the bonding portion is thicker than the other portion of the first insulating layer.

7. A silicon platform for optical modules according to claim 1, wherein the first conductor layer, the second insulating layer and the second conductor layer constitutes a microstrip line structure.

8. A silicon platform for optical modules according to claim 1, wherein the second conductor layer constitutes a coplanar distribution constant circuit structure.

9. A silicon platform for optical modules according to claim 1, which is electrically connected to a driver IC by lead wires.

10. A silicon platform for optical modules according to claim 1, wherein at least one of a light emitting element and a light-receiving element are mounted.

11. A silicon platform for optical modules according to claim 1, wherein the first insulating layer is an oxide layer.

12. A silicon platform for optical modules according to claim 1, wherein the first insulating layer is an $SiO_2$ insulating layer.

13. A silicon platform for optical modules according to claim 1, wherein the second insulating layer is a resin layer.

14. A silicon platform for optical modules according to claim 1, wherein the second insulating layer is a polyimide layer.

* * * * *